United States Patent
Zubkov et al.

(12)

(10) Patent No.: US 7,015,096 B1
(45) Date of Patent: Mar. 21, 2006

(54) BIMETALLIC OXIDE COMPOSITIONS FOR GATE DIELECTRICS

(75) Inventors: Vladimir Zubkov, Mountain View, CA (US); Sey-Shing Sun, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 13 days.

(21) Appl. No.: 10/883,137

(22) Filed: Jul. 1, 2004

Related U.S. Application Data

(60) Provisional application No. 60/485,032, filed on Jul. 2, 2003.

(51) Int. Cl.
*H01L 21/336* (2006.01)

(52) U.S. Cl. .................. 438/257; 438/785; 257/761

(58) Field of Classification Search ............... 438/257, 438/295, 761, 762, 784, 785; 257/741, 761
See application file for complete search history.

(56) References Cited

U.S. PATENT DOCUMENTS

| | | | | |
|---|---|---|---|---|
| 5,124,289 A | * | 6/1992 | Martin et al. .................. | 502/4 |
| 6,566,147 B1 | * | 5/2003 | Basceri et al. ................. | 438/3 |

OTHER PUBLICATIONS

Matti Putkonen et al., "Enhanced growth rate in atomic layer epitaxy deposition of magnesium oxide thin films", *J. Mater. Chem.*, 2000 vol. 10, pp. 1857-1861.

Matti Putkonen et al., "Surface-controlled growth of magnesium oxide thin films by atomic layer epitaxy", *J. Mater. Chem.*, 1999, vol. 9, pp. 2449-2452.

Timo Hatanpää "Properties of $[Mg_2(thd)_4]$ as a Precursor for Atomic Layer Deposition of MgO Thin Films and Crystal Structures of $[Mg_2(thd)_4]$ and $[Mg(thd)_2(EtOH)_2]$", *Chem. Mater.*, 1999, vol. 11, No. 7, pp. 1846-1852.

Mikko Ritala et al., "Atomic Layer Deposition", *Handbook of Thin Film Materials*, vol. 1: Deposition and Processing of Thin Films, pp. 103-159.

* cited by examiner

*Primary Examiner*—Phuc T. Dang
(74) *Attorney, Agent, or Firm*—Barnes & Thornburg, LLP

(57) ABSTRACT

In one embodiment, bimetallic oxide compositions for gate dielectrics that include two or more of the elements Ca, Sr, Ba, Hf, and Zr are described.

38 Claims, No Drawings

BIMETALLIC OXIDE COMPOSITIONS FOR GATE DIELECTRICS

This application claims priority under 35 U.S.C. § 119(e) to U.S. Provisional Application Ser. No. 60/485,032, filed on Jul. 2, 2003, the disclosure of which is hereby incorporated by reference herein.

CROSS REFERENCE

Cross reference is made to copending U.S. patent application Ser. No. 10/600,665 entitled "Method of Chemically Altering a Silicon Surface and Associated Electrical Devices" and to U.S. Pat. No. 6,627,556 entitled "Method of Chemically Altering a Silicon Surface and Associated Electrical Devices," each of which is assigned to the same assignee as the present application.

FIELD

The present disclosure relates generally to bimetallic oxide compositions for gate dielectrics. The present disclosure particularly relates to bimetallic oxide compositions for gate dielectrics that include two or more of the elements Ca, Sr, Ba, Hf, and Zr.

BACKGROUND

The shrinking of the field-effect device channel length requires an increase in the capacitance of the gate dielectric in order to achieve desired performance. There are difficulties associated with decreasing the oxide thickness in a reproducible fashion when that gate dielectric is $SiO_2$. Leakage currents are unacceptable when the oxide thickness is less than 1.2 nm. An alternative approach has been to deposit high-k dielectrics. However, a difficulty with this approach is that, in general, these materials are mismatched with the underlying silicon lattice. This leads to formation of additional interface states, which degrades the device performance. These relatively high dielectric material display temperature sensitivity with respect to micro-crystal formation, migration phenomenon, and relatively low intrinsic dielectric constants. In addition, these materials are not easy to alter or modify.

SUMMARY

The present disclosure includes one or more of the following features, or combination thereof:

According to one illustrative embodiment, there is provided a method of forming a dielectric material on a silicon surface. The method includes forming a first layer including a first element selected from IIA of the periodic table on the silicon surface so as to chemically couple the first element to a silicon atom of said silicon surface and forming a second layer including a second element selected from group IVB of the periodic table so as to chemically couple the second element to the first element. The first element may be selected from the group consisting of Ca, Sr, and Ba. The second element may be selected from the group consisting of Hf and Zr. The first and second layers may be formed using atomic layer deposition or molecular beam epitaxy. The method may also include covalently bonding a hydroxyl group to the silicon atom of the silicon surface prior to forming the first layer.

In one alternative embodiment of the above-described method, forming the first layer may include reacting MII (thd)$_2$, wherein MII is the first element and thd is tetramethyl heptadione, with the hydroxyl group bound to the silicon atom of the silicon surface so as to chemically couple an atom of the first element to the silicon atom of said silicon surface. The method may further include covalently bonding a hydroxyl group to the atom of the first element by, for example, exposing the silicon surface to $O_3(H_2O_2)$ so as to generate the hydroxyl group bound to the atom of the first element. In addition, forming the second layer may include reacting MIV(OR)$_4$, wherein MIV is the second element and R is an alkyl, with the hydroxyl group bound to the atom of the first element so as to chemically couple an atom of the second element to the atom of the first element. The method may yet further include covalently bonding a hydroxyl group to the atom of the second element by, for example, exposing said silicon surface to $H_2O$ so as to generate the hydroxyl group bound to the atom of the first element.

In another alternative embodiment of the above-described method, forming the first layer includes reacting MII $(C_5H_5)_2$, wherein MII is said first element, with the hydroxyl group bound to the silicon atom of the silicon surface so as to chemically couple an atom of the first element to the silicon atom of the silicon surface. The method may further include covalently bonding a hydroxyl group to the atom of said element by, for example, exposing the silicon surface to $H_2O$ so as to generate the hydroxyl group bound to the atom of the first element. In addition, forming the second layer may include reacting MIV(OR)$_4$, wherein MIV is said second element and R is an alkyl, with the hydroxyl group bound to the atom of the first element so as to chemically couple an atom of the second element to the atom of the first element. The method may yet further include covalently bonding a hydroxyl group to the atom of the second element by, for example, exposing the silicon surface to $H_2O$ so as to generate the hydroxyl group bound to the atom of the first element.

In another embodiment of the present disclosure, there is provided a method of forming a dielectric material on a silicon surface. The method includes reacting a halide of a first element having only one positive divalent oxidation state with a hydroxyl group bound to a silicon atom of the silicon surface so as to chemically couple the first element to the silicon atom of the silicon surface. The method can also include hydrolyzing a bond between a halogen atom and an atom of the first element so as to generate a hydroxyl group bound to the atom of the first element. The method can further include reacting a halide of a second element selected from the group consisting of Hf and Zr with the hydroxyl group bound to the atom of the first element so as to chemically couple the halide of the second element to the atom of the first element. In addition, hydrolyzing a bond between a halogen atom and an atom of the second element so as to generate a hydroxyl group bound to the atom of the second element can be performed.

Furthermore, in the above-described method of chemically altering a silicon surface, condensing the hydroxyl group bound to the atom of the second element with a hydroxyl group of an adjacent atom of the second element can be performed. The first element can be selected from group IIA of the periodic table. The first element can be selected from the group consisting of Ca, Sr, and Ba. The halide can include chlorine. For example, the halide can be calcium chloride. The method can also include heating the silicon surface in a reaction chamber to cause unreacted halide of the first element to vaporize while maintaining a pressure in the reaction chamber which is sufficiently less than atmospheric pressure to cause the evacuation of vaporized unreacted halide of the first element from the reaction chamber. The method can further include, exposing the silicon surface to a substance selected from the group consisting of vaporized hydrogen peroxide, a mixture of vaporized water and ammonia, or vaporized water. In addition, the method can include reacting the halide of the second element with the hydroxyl group bound to the atom of the first element in the presence of ammonia. The second element can be selected from group IVB of the periodic table. For example, the halide of the second element can be $HfCl_4$ or $ZrCl_4$.

In yet another embodiment of the present disclosure, an electronic device is provided. The electronic device can include a silicon substrate, an atom of a first element having only one positive divalent oxidation state chemically coupled to a silicon atom of the silicon substrate, and an atom of a second element selected from the group consisting of Hf and Zr chemically coupled to the atom of the first element having only one positive divalent oxidation state. The atom of the first element having only one positive divalent oxidation state can be an atom of an element selected from group IIA of the periodic table.

In yet a further embodiment of the present disclosure a semiconductor device is provided that includes a dielectric material which includes (i) an atom of a first element having only one positive divalent oxidation state chemically coupled to a silicon atom of a silicon substrate of the dielectric material and (ii) an atom of a second element selected from the group consisting of Hf and Zr chemically coupled to the atom of the first element having only one positive divalent oxidation state.

DETAILED DESCRIPTION OF THE DISCLOSURE

While the invention is susceptible to various modifications and alternative forms, specific exemplary embodiments thereof have been shown by way of example in the drawings and will herein be described in detail. It should be understood, however, that there is no intent to limit the invention to the particular forms disclosed, but on the contrary, the intention is to cover all modifications, equivalents, and alternatives falling within in the spirit and scope of the invention.

The present disclosure relates to altering a silicon surface so as to create a dielectric material on the silicon surface. The dielectric material is a bimetallic oxide composition based on elements chosen from groups IIA and IVB. The dielectric material may be used in the creation of semiconductor devices, such as transistors. For example, the aforementioned silicon surface can be defined on an electronic device, such as a semiconductor wafer, by a silicon substrate. The dielectric material may be created on the silicon substrate to form, for example, a gate dielectric of a transistor. Accordingly, the creation of the dielectric bimetallic oxide composition on the silicon surface is disclosed in the context of the creation of gate dielectrics, however it is contemplated that the dielectric bimetallic oxide materials are useful in other applications as well.

Properties of dielectric materials are considerations in the formation of gate dielectrics. One such property is the k value of the dielectric material. Dielectric materials with high k values are generally desirable. The prediction that some of IIA–IVB oxides can be effective high-k dielectrics is based on analysis of relevant properties of the IIA–IVB oxides. It is desirable that the k values of the IIA–IVB oxides correspond to medium range values (k>10) or greater. An effective empirical scheme for prediction of k values, as described in R. D. Shannon, "Dielectric polarizabilities of ions in oxides and fluorides", J. Appl. Phys., v. 73, 346 (1993), incorporated herein by reference, was utilized. Results using this scheme indicates satisfactory k values for various oxide compounds as set forth below in Table 1.

An additional property for consideration is the thermodynamic stability of the gate dielectric. Generally, gate dielectrics should be thermodynamically stable in contact with silicon at temperatures up to more than about 1000° C. Binary oxides with IIA=Ca, Sr, or Ba and with IVB=Zr or Hf should be stable in contact with silicon at such high temperatures.

Yet another gate dielectric property for consideration is the conduction band offset (CBO) of the dielectric material. A low conduction band offset of high-k dielectrics may cause substantial leakage through the gate dielectric. The CBO value is closely related to the band gap. Generally, the bigger the band gap the larger the CBO value. For example, silicon dioxide has a band gap of approximately 9 eV and a CBO of about 3.6 eV. Based on existing experimental data, it appears that a band gap not much less than 6 eV is desirable. In such cases, the CBO typically exceeds 1 eV, which is considered satisfactory. For example, $HfO_2$ has a band gap close to 6 eV and an evaluated CBO 0.8–1.5 eV.

One difficulty in determining the band gap of a dielectric is that existing theoretical methods can underestimate the band gap by up to 50%. However, such methods can still be used for relative estimates. The band gap value of 3.9 eV calculated for $HfO_2$ can be used as a guideline. Accordingly, if the calculated band gaps for IIA–IVB oxides are close to that of $HfO_2$, e.g., less than 3.9 eV by not more than 0.5 eV, it can be assumed that the corresponding CBO will be big enough so as not to induce a noticeable leakage. For $HfO_2$, the calculation of the band gap was performed for its crystalline form using the Vienna Ab initio Simulating Package (VASP) (G. Kresse and J. Furthmuller, "Efficiency of ab-initio total energy calculations for metals and semiconductors using plane wave basis set", Comp. Mater. Sci., v 6, 15 (1996), which is incorporated herein by reference. Crystalline forms of IIA–IVB oxides are perovskites. Accordingly, the band gap calculation for IIA–IVA and IIA–IVB oxides was performed for their experimental perovskite structures if such perovskites exist. When no experimental data was found, calculations were carried out for perovskite-like structures. Usually the band gaps for crystalline and amorphous phases are similar in value.

TABLE 1

Calculated band gaps and k-values for IIA–IVA and IIA–IVB oxides and some other oxides.

| Oxide | Band gap (eV) | k value** |
|---|---|---|
| $HfO_2$ | 3.9 | 25.4 |
| $MgZrO_3$* | 1.0 | — |
| $CaTiO_3$ | 1.5 | — |
| $SrTiO_3$ | 1.6 | — |
| $CaZrO_3$ | 3.4 | 13.1 |
| $CaHfO_3$* | 3.7 | 13.8 |
| $SrZrO_3$ | 3.6 | 12.3 |
| $SrHfO_3$ | 3.7 | 13.5 |
| $BaZrO_3$ | 3.5 | 24.8 |
| $BaHfO_3$* | 3.6 | 26.2 |
| $CaSnO_3$ | 0.2 | — |
| $CaPbO_3$* | 0.9 | — |

*no such perovskites were reported
**k were evaluated only for band gaps > 3 eV

Based on the calculations shown in Table 1, combinations of group IIA elements Ca, Sr, Ba with group IVB elements Zr and Hf are found to lead to oxides suitable for gate dielectrics with medium and high k values and acceptable band gap and conduction band offsets. One reason for using group IIA metals is that these divalent metal precursors will react with hydroxyls of suitably prepared silicon surfaces and the generated interface oxide will have minimum interface states. Accordingly, the first deposited layer includes IIA metal oxides. The following second deposited layer is a group IVB oxide layer. This process may be repeated to reach the desired total thickness.

Deposition of IIA–IVB oxides can be achieved via one of a number of methods including physical vapor deposition (PVD), e.g., sputtering and molecular beam epitaxy (MBE), and chemical vapor deposition (CVD), e.g., atomic layer deposition (ALD). Atomic layer deposition has proven to achieve controllable thin and conformal coating on challenging device features in integrated circuit (IC) devices. Accordingly, ALD is an appropriate method for creation of a sequence of layers with different chemical structures. However, other methods, e.g., MBE, may also be utilized for the deposition of the IIA–IVB oxides. When using such other methods as MBE, the crystalline phase should be suppressed during growth.

Set forth below are several methods for the deposition of IIA–IVB oxides with the first layer being that of group IIA metal oxides. However, the list of methods described below is not exhaustive and it is contemplated that other methods for deposition of IIA–IVB oxides may be used. The first four methods described below are ALD methods using different precursors. In each ALD method two reactions are cited. The first reaction (a) involves group IIA elements and the second reaction (b) involves group IVB elements. One result of the ALD methods described below is the formation of an amorphous structure of generated oxides. This formation is due to the ALD deposition and will reduce leakage compared to crystalline structure that may lead to polycrystalline regions with grain boundaries that facilitate leakage current. The first deposited layer of IIA divalent metal oxides should decrease interface states and improve interface. The final method shown below uses molecular beam epitaxy (MBE).

For each ALD method described below, the silicon surface to be altered in accordance with the present disclosure is cleaned with any known appropriate cleaning solution to remove oxides therefrom. After removing oxides from the silicon surface in the aforementioned manner, the surface is exposed to a hydrolyzing atmosphere such that the silicon atoms on the surface to be altered have a free hydroxyl group covalently bound thereto. For example, contacting the silicon surface with steam or vaporized hydrogen peroxide in a known manner can be utilized to generate free hydroxyl groups covalently bound to the silicon atoms. Once the silicon surface is prepared, one of the following methods 1–4 may be used for the deposition of the IIA–IVA oxides.

Method 1

(a) $MIICl_2 + H_2O$, MII=Ca,Sr,Ba (b) $MIVCl_4 + H_2O$, MIV=Hf, Zr

After preparing the silicon surface in the above described manner, the hydroxyl groups bounded to the silicon atoms are reacted with a halide of an element that exhibits only one positive divalent oxidation state, e.g. Ca, Sr, or Ba. What is meant herein by a "halide" is a compound of the type $MX_n$, where X is a halogen (e.g. chlorine) and M is another element. With respect to elements that exhibit only one positive divalent oxidation state, as indicated above examples of such elements are those contained in group IIA of the periodic table. For example, calcium of group IIA can be utilized as the aforementioned element which exhibits only one positive divalent oxidation state. To initiate the alteration, a stoichiometric excess of the aforementioned halide relative to the hydroxyl groups is placed in contact with the silicon surface under vacuum conditions in a reaction chamber. In particular, the halide is introduced into the reaction chamber in gaseous form so that the halide contacts the silicon surface. Note that as used herein "vacuum conditions" means that gas is being removed from the reaction chamber so that the pressure in the reaction chamber is less that atmospheric. The silicon surface (e.g. the silicon surface of an electrical device such as a semiconductor wafer) is then heated at a sufficient temperature (e.g. about 200° C. to about 300° C.) such that (i) the halide reacts with the hydroxyls from the underlying silicon surface and (ii) the unreacted halide is vaporized and removed from the reaction chamber. An example of this initial alteration of a silicon surface is schematically illustrated below using calcium chloride ($CaCl_2$) as an exemplary halide. Note that the chemical reactions and structures shown below are merely illustrative and additional and/or alternative reactions, structures, and/or byproducts may occur.

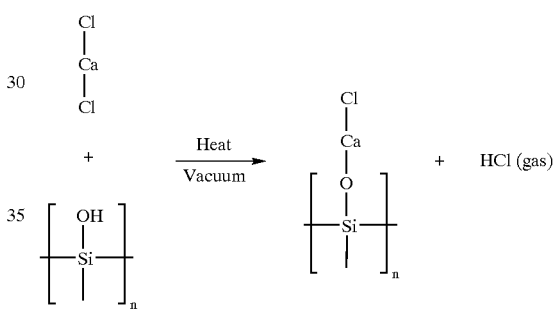

The unreacted calcium chloride has a vapor pressure of about 8 mTorr at about 412° C. and thus can be removed under vacuum conditions with the hydrogen chloride (HCl) gas product as a by-product of the calcium chloride/silicon surface reaction. The HCL gas by-product may etch the forming oxide and, therefore, is removed by use of a properly designed reactor. Preferably all by-products of the surface reaction, including all of the by-products of the surface reaction products described below, should be removed from the reaction chamber as quickly as possible (e.g. via a vacuum pump) so as to ensure the surface reaction is driven to completion. As illustrated above, the reaction of the halide with the silicon surface results in the halide being chemically coupled to a silicon atom of the silicon substrate via a covalent bond with the oxygen atom of the hydroxyl group.

After reacting the silicon surface with the halide in the above described manner, the surface is heated (e.g. to about 200° C.) under vacuum conditions and exposed to vaporized hydrogen peroxide ($H_2O_2$), or a stream of vaporized water and ammonia ($NH_3$), or vaporized water ($H_2O$) so as to hydrolyze bonds between halogen atoms and atoms of the element that exhibits only one positive divalent oxidation state and thereby generate a hydroxyl group bound to atoms of the element. The process of hydrolyzing bonds between halogen atoms and atoms of the element is schematically illustrated below with hydrogen peroxide. Again, it should be understood that the chemical reactions and structures shown below are merely illustrative and additional and/or alternative reactions, structures, and/or by-products may occur.

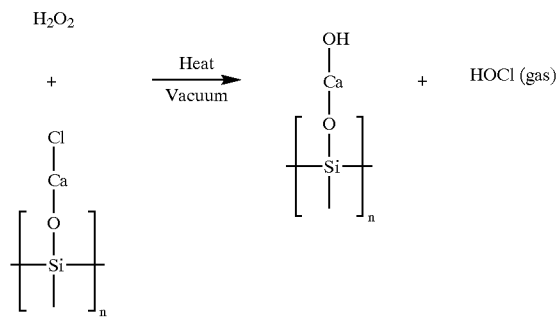

As illustrated above, hydrolyzing bonds between halogen atoms and atoms of the element results in atoms of the element being covalently bound to a hydroxyl group.

After hydrolyzing bonds between halogen atoms and atoms of the element as described above, the chemically altered silicon surface is reacted with a halide of an element selected from the group Hf and Zr. For example, hafnium tetrachloride or zirconium tetrachloride can be reacted with the silicon surface after the above described hydrolysis step. To initiate the reaction, a stoichiometric excess of the aforementioned halide molecule (e.g. hafnium tetrachloride or zirconium tetrachloride) relative to the hydroxyl groups bound to the element is placed in contact with the silicon surface under vacuum conditions in a reaction chamber. In particular, hafnium tetrachloride and/or zirconium tetrachloride is advanced into the reaction chamber so as to contact the silicon surface. For example, hafnium tetrachloride or zirconium tetrachloride heated to 160° C. has a vapor pressure of about 9 mTorr and thus can be advanced into the reaction chamber in a gaseous form and reacted with the silicon surface. The hafnium tetrachloride and/or zirconium tetrachloride may be advanced into the reaction chamber by use of an inert gas, e.g., nitrogen, as a transportation mechanism. The silicon surface is heated at a sufficient temperature (e.g. about 200° C. to about 300° C.) in the presence of the gaseous hafnium tetrachloride and/or zirconium tetrachloride such that (i) the hafnium tetrachloride and/or zirconium tetrachloride reacts with the hydroxyls bound to the element and (ii) the unreacted hafnium tetrachloride and/or zirconium tetrachloride is vaporized and removed from the reaction chamber. An example of this reaction is schematically illustrated below with hafnium tetrachloride with the understanding that the chemical reactions and structures shown below are merely illustrative and additional and/or alternative reactions, structures, and/or by-products may occur.

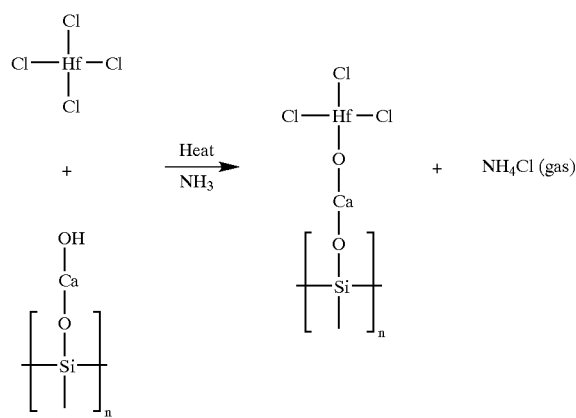

As illustrated above, the reaction of hafnium tetrachloride molecules with the hydroxyls bound to the element results in the hafnium tetrachloride moiety being chemically coupled to a silicon atom of the surface via a covalent bond with the oxygen atom bound to the element (e.g. Ca).

After reacting the chemically altered silicon surface with hafnium tetrachloride and/or zirconium tetrachloride molecules in the above described manner, bonds between halogen atoms and the hafnium or zirconium atom of are hydrolyzed so as to generate hydroxyl groups bound thereto. For example, the silicon surface is heated (e.g. from about 200° C. to about 300° C.) under vacuum conditions and exposed to vaporized hydrogen peroxide ($H_2O_2$), or a stream of vaporized water and ammonia ($NH_3$), or vaporized water ($H_2O$) so as to hydrolyze bonds between halogen atoms and the hafnium or zirconium atom. An example of this reaction is schematically illustrated below with the understanding that the chemical reactions and structures shown below are merely illustrative and additional and/or alternative reactions, structures, and/or byproducts may occur.

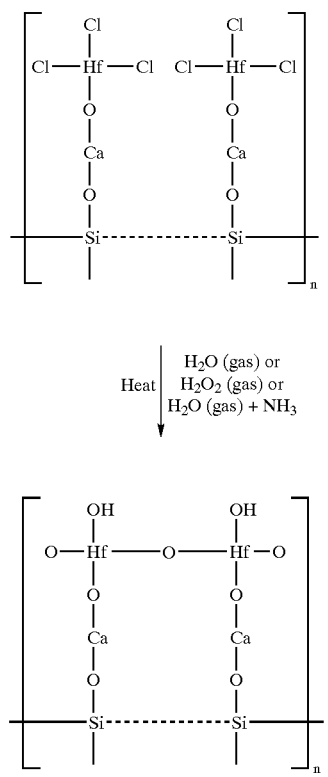

As illustrated above, it should be appreciated that heating the silicon surface in the above described manner also results in the condensation of the hafnium or zirconium atom hydroxyl groups which are positioned in the plane that is parallel to the plane defined by the silicon atoms. For example, the hydroxyl of a hafnium or zirconium atom which is positioned in the parallel plane is condensed with a hydroxyl group of an adjacent hafnium or zirconium atom which is also positioned in the parallel plane.

The above described process can then be started over so as to dispose another layer of dielectric material onto the silicon surface. For example, to initiate a second cycle of deposition of a dielectric material onto the silicon surface, as described above, calcium chloride ($CaCl_2$) is introduced into the reaction chamber to react with the free hydroxyl groups bound to hafnium or zirconium atom. For example, calcium chloride is reacted with the hydroxyl groups extending above the plane which is parallel to the plane defined by the silicon atoms. Thereafter, hydroxyls are introduced onto the calcium atoms and then the hydroxyls are reacted with hafnium or zirconium halide molecules with the subsequent introduction and condensation of hydroxyls on the hafnium or zirconium atom moieties.

Method 2

(a) $MII(thd)_2 + O_3$ (or $H_2O_2$), wherein MII=Ca,Sr,Ba (b) $MIV(OR)_4 + H_2O$, wherein MIV=Hf, Zr In method 2 shown above, thd is tetramethyl heptadione: $CH_3—C(CH_3)—CO—CH_2—CO—C(CH_3)_2—CH_3$ and R is an alkyl. It should be noted that in reaction (a) $H_2O$ is not used because thd decomposes before the reaction $MII(thd)_2 + H_2O$ starts. The silicon surface is prepared in the previously described manner similar to method 1. The hydroxyl groups bounded to the silicon atoms are reacted with $MII(thd)_2$ molecules wherein MII is an element that exhibits only one positive divalent oxidation state, e.g. Ca, Sr, or Ba. To initiate the alteration, a stoichiometric excess of the aforementioned $MII(thd)_2$ relative to the hydroxyl groups is placed in contact with the silicon surface under vacuum conditions in a reaction chamber. In particular, the $MII(thd)_2$ molecules are introduced into the reaction chamber in gaseous form so that the $MII(thd)_2$ contacts the silicon surface. The silicon surface (e.g. the silicon surface of an electrical device such as a semiconductor wafer) is then heated at a sufficient temperature (e.g. about 200° C. to about 300° C.) such that (i) the $MII(thd)_2$ reacts with the hydroxyls from the underlying silicon surface and (ii) the unreacted $MII(thd)_2$ is vaporized and removed from the reaction chamber. An example of this initial alteration of a silicon surface is schematically illustrated below using $Ca(thd)_2$ as an exemplary $MII(thd)_2$ with the understanding that other forms of $MII(thd)_2$ may be used. Note that the chemical reactions and structures shown below are merely illustrative and additional and/or alternative reactions, structures, and/or by-products may occur:

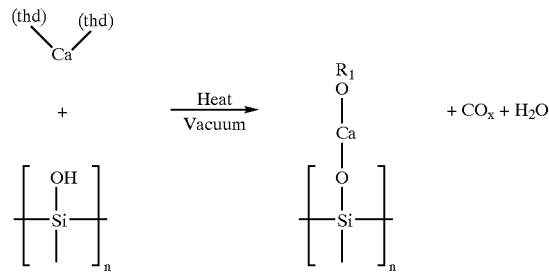

(Note that alkyl $R_1$ may differ from R in above reaction (b))

Preferably all by-products of the surface reaction, including all of the by-products of the surface reaction products described below, should be removed from the reaction chamber as quickly as possible (e.g. via a vacuum pump) so as to ensure the surface reaction is driven to completion. As illustrated above, the reaction of the $MII(thd)_2$ with the silicon surface results in a $MII—OR_1$ moiety being chemically coupled to a silicon atom of the silicon substrate via a covalent bond with the oxygen atom of the hydroxyl group.

After reacting the silicon surface with the halide in the above described manner, the surface is heated (e.g. to about 200° C.) under vacuum conditions and exposed to $O_3$ (or $H_2O_2$) so as to hydrolyze bonds $MII—O—R_1$ and thereby generate a hydroxyl group bound to MII. The process of hydrolyzing bonds between atoms of alkoxy group, $O—R_1$, and atoms of MII is schematically illustrated below with MII=Ca and $O_3$ (or $H_2O_2$) as an oxidizer. Again, it should be understood that the chemical reactions and structures shown below are merely illustrative and additional and/or alternative reactions, structures, and/or by-products may occur.

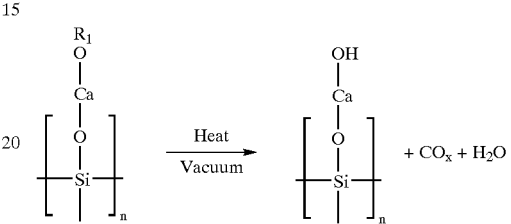

As illustrated above, hydrolyzing bonds between atoms of alkoxy group, $O—R_1$, and atoms of MII results in atoms of MII being covalently bound to a hydroxyl group.

After hydrolyzing bonds between atoms of alkoxy group, $O—R_1$, and atoms of MII as described above, the chemically altered silicon surface is reacted with $MIV(OR)_4$ molecules wherein R is an alkyl and MIV is an element selected from the group Hf and Zr. To initiate the reaction, a stoichiometric excess of the aforementioned $MIV(OR)_4$ molecule relative to the hydroxyl groups bound to the element is placed in contact with the silicon surface under vacuum conditions in a reaction chamber. In particular, $MIV(OR)_4$ molecules are advanced into the reaction chamber so as to contact the silicon surface. The $MIV(OR)_4$ may be advanced into the reaction chamber by use of an inert gas as a transportation mechanism. The silicon surface is heated at a sufficient temperature (e.g. about 200° C. to about 300° C.) in the presence of the gaseous $MIV(OR)_4$ such that (i) the $MIV(OR)_4$ reacts with the hydroxyls bound to the element and (ii) the unreacted $MIV(OR)_4$ is vaporized and removed from the reaction chamber. An example of this reaction is schematically illustrated below with the understanding that the chemical reactions and structures shown below are merely illustrative and additional and/or alternative reactions, structures, and/or byproducts may occur.

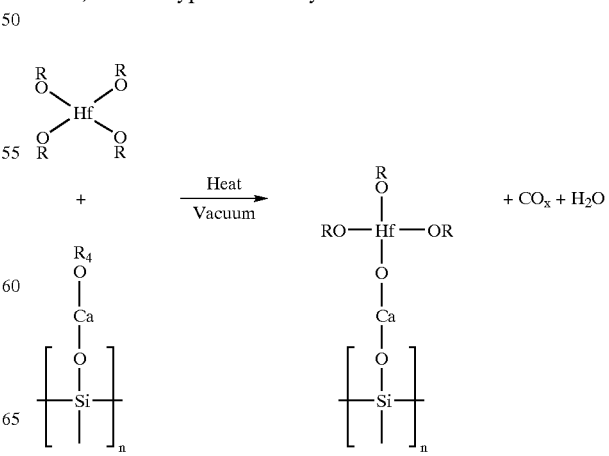

As illustrated above, the reaction of the MIV(OR)$_2$ molecules with the hydroxyls bound to the element results in the MIV(OR)$_2$ moiety being chemically coupled to a silicon atom of the surface via a covalent bond with the oxygen atom bound to the element MII (e.g., Ca).

After reacting the chemically altered silicon surface with MIV(OR)$_4$ molecules in the above described manner, bonds between atoms of alkoxy group, O—R$_1$, and the MIV (e.g., hafnium) atom are hydrolyzed so as to generate hydroxyl groups bound thereto. For example, the silicon surface is heated (e.g. from about 200° C. to about 300° C.) under vacuum conditions and exposed to vaporized water (H$_2$O) so as to hydrolyze bonds between atoms of alkoxy group and the MIV atom (e.g., hafnium or zirconium atom). An example of this reaction is schematically illustrated below with the understanding that the chemical reactions and structures shown below are merely illustrative and additional and/or alternative reactions, structures, and/or by-products may occur.

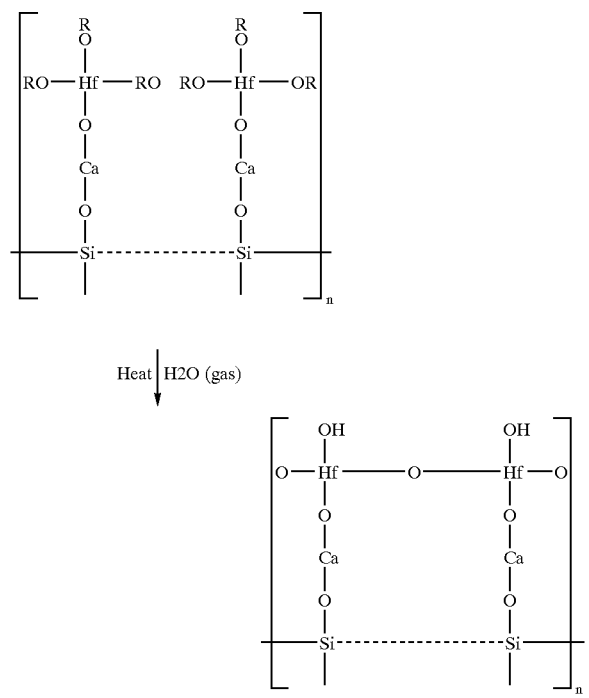

As illustrated above, it should be appreciated that heating the silicon surface in the above described manner also results in the condensation of the MIV (e.g., hafnium or zirconium) atom hydroxyl groups which are positioned in the plane that is parallel to the plane defined by the silicon atoms. For example, the hydroxyl of a hafnium or zirconium atom, which is positioned in the parallel plane, is condensed with a hydroxyl group of an adjacent hafnium or zirconium atom that is also positioned in the parallel plane.

The above described process can then be started over so as to dispose another layer of dielectric material onto the silicon surface. For example, to initiate a second cycle of deposition of a dielectric material onto the silicon surface, as described above, MII(thd)$_2$ molecules, wherein MII is an element that exhibits only one positive divalent oxidation state, e.g. Ca, Sr, or Ba, are introduced into the reaction chamber to react with the free hydroxyl groups bound to hafnium atom. For example, the MII(thd)$_2$ is reacted with the hydroxyl groups extending above the plane which is parallel to the plane defined by the silicon atoms. Thereafter, hydroxyls are introduced onto the MII atoms and then the hydroxyls are reacted with MIV(OR)$_4$ molecules with the subsequent introduction and condensation of hydroxyls on the MIV atom moieties.

Method 3

(a) MII(C$_5$H$_5$)$_2$+H$_2$O, wherein MII=Ca,Sr,Ba (b) MIV(OR)$_4$+H$_2$O, wherein MIV=Hf, Zr In method 3 shown above, MII(C$_5$H$_5$) 2 is a metallecene sandwich and R is an alkyl. In this method, the silicon surface is prepared as described above. The process used to deposit the MII and MIV elements on the silicon surface is similar to the ALD process described above in Methods 1 and/or 2.

Method 4

MII(OR)$_2$+MIVCl$_4$, wherein MII=Ca,Sr,Ba and MIV=Hf, Zr

In method 4 shown above, R is an alkyl. In this method, the silicon surface is prepared as described above. The processed used to deposit the MII and MIV elements on the silicon surface is similar the ALD process described above in Methods 1 and/or 2 except that oxidizers are not used in this method. Because oxidizers are not used, the chance of oxidizing the Si surface is reduced.

Method 5

(a) MII+O$_2$, wherein MII=Ca,Sr,Ba (b) MIV+O$_2$, wherein MIV=Hf, Zr

Molecular beam epitaxy (MBE) is used in this method for the deposition of the MII and MIV elements. Because the low vapor pressure of the metals demands a high temperature for metal beam generation, a difficulty associated with this method is the possibility of crystalline structure generation.

While the disclosure is susceptible to various modifications and alternative forms, specific exemplary embodiments thereof have been shown by way of example in the drawings and has herein been described in detail. It should be understood, however, that there is no intent to limit the disclosure to the particular forms disclosed, but on the contrary, the intention is to cover all modifications, equivalents, and alternatives falling within the spirit and scope of the disclosure.

There are a plurality of advantages of the present disclosure arising from the various features of the apparatus and methods described herein. It will be noted that alternative embodiments of the apparatus and methods of the present disclosure may not include all of the features described yet still benefit from at least some of the advantages of such features. Those of ordinary skill in the art may readily devise their own implementations of an apparatus and method that incorporate one or more of the features of the present disclosure and fall within the spirit and scope of the present disclosure.

The invention claimed is:

1. A method of forming a dielectric material on a silicon surface, comprising:
   (a) forming a first layer including a first element selected from group IIA of the periodic table on said silicon surface so as to chemically couple said first element to a silicon atom of said silicon surface, and
   (b) forming a second layer including a second element selected from group IVB of the periodic table so as to chemically couple said second element to said first element.

2. The method of claim 1, wherein:
   said first element is selected from the group consisting of Ca, Sr, and Ba.

3. The method of claim 1, wherein:
   said second element is selected from the group consisting of Hf and Zr.

4. The method of claim 1, wherein:
   forming the first and second layers includes forming the first and second layers using atomic layer deposition.

5. The method of claim 1, wherein:
   forming the first and second layers includes forming the first and second layers using molecular beam epitaxy.

6. The method of claim 1, further comprising:
   (c) covalently bonding a hydroxyl group to said silicon atom of said silicon surface prior to step (a).

7. The method of claim 6, wherein:
   (a) includes reacting $MII(thd)_2$ with said hydroxyl group bound to said silicon atom of said silicon surface so as to chemically couple an atom of said first element to said silicon atom of said silicon surface, wherein MII is said first element and thd is tetramethyl heptadione.

8. The method of claim 7, wherein $MII(thd)_2$ includes $Ca(thd)_2$.

9. The method of claim 7, further comprising:
   (d) covalently bonding a hydroxyl group to said atom of said first element.

10. The method of claim 9, wherein:
    (d) includes exposing said silicon surface to $O_3$ so as to generate said hydroxyl group bound to said atom of said first element.

11. The method of claim 9 wherein:
    (d) includes exposing said silicon surface to $H_2O_2$ so as to generate said hydroxyl group bound to said atom of said first element.

12. The method of claim 9, wherein:
    (b) includes reacting $MIV(OR)_4$ with said hydroxyl group bound to said atom of said first element so as to chemically couple an atom of said second element to said atom of said first element, wherein MIV is said second element and R is an alkyl.

13. The method of claim 12, wherein $MIV(OR)_4$ includes $Hf(OR)_4$.

14. The method of claim 12, further comprising
    (e) covalently bonding a hydroxyl group to said atom of said second element.

15. The method of claim 14, wherein:
    (e) includes exposing said silicon surface to $H_2O$ so as to generate said hydroxyl group bound to said atom of said first element.

16. The method of claim 6, wherein:
    (a) includes reacting $MII(C_5H_5)_2$ with said hydroxyl group bound to said silicon atom of said silicon surface so as to chemically couple an atom of said first element to said silicon atom of said silicon surface, wherein MII is said first element.

17. The method of claim 16, wherein $MII(C_5H_5)_2$ includes $Ca(C_5H_5)_2$.

18. The method of claim 17, further comprising:
    (d) covalently bonding a hydroxyl group to said atom of said first element.

19. The method of claim 18, wherein:
    (d) includes exposing said silicon surface to $H_2O$ so as to generate said hydroxyl group bound to said atom of said first element.

20. The method of claim 18, wherein:
    (b) includes reacting $MIV(OR)_4$ with said hydroxyl group bound to said atom of said first element so as to chemically couple an atom of said second element to said atom of said first element, wherein MIV is said second element and R is an alkyl.

21. The method of claim 20, wherein $MIV(OR)_4$ includes $Hf(OR)_4$.

22. The method of claim 20, further comprising
    (e) covalently bonding a hydroxyl group to said atom of said second element.

23. The method of claim 22, wherein:
    (e) includes exposing said silicon surface to $H_2O$ so as to generate said hydroxyl group bound to said atom of said first element.

24. A method of forming a dielectric material on a silicon surface, comprising:
    (a) reacting a halide of a first element having only one positive divalent oxidation state with a hydroxyl group bound to a silicon atom of said silicon surface so as to chemically couple said first element to said silicon atom of said silicon surface;
    (b) hydrolyzing a bond between a halogen atom and an atom of said first element so as to generate a hydroxyl group bound to said atom of said first element; and
    (c) reacting a halide of a second element selected from the group consisting of Hf and Zr with said hydroxyl group bound to said atom of said first element so as to chemically couple said halide of said second element to said atom of said first element.

25. The method of claim 24 further comprising:
    (d) hydrolyzing a bond between a halogen atom and an atom of said second element so as to generate a hydroxyl group bound to said atom of said second element.

26. The method of claim 25, wherein:
    (d) includes condensing said hydroxyl group bound to said atom of said second element with a hydroxyl group of an adjacent atom of said second element.

27. The method of claim 24, wherein:
    said first element is selected from group IIA of the periodic table.

28. The method of claim 27, wherein:
    said first element is selected from the group consisting of Ca, Sr, and Ba.

29. The method of claim 24, wherein:
    said halide includes chlorine.

30. The method of claim 24, wherein:
    said halide includes calcium chloride.

31. The method of claim 24, wherein:
    (a) includes heating said silicon surface in a reaction chamber to cause unreacted halide of said first element to vaporize while maintaining a pressure in said reaction chamber which is sufficiently less than atmospheric pressure to cause the evacuation of vaporized unreacted halide of said first element from said reaction chamber.

32. The method of claim 24, wherein:
(b) includes exposing said silicon surface to a substance selected from the group consisting of vaporized hydrogen peroxide, a mixture of vaporized water and ammonia, or vaporized water.

33. The method of claim 24, wherein:
(c) includes reacting said halide of said second element with said hydroxyl group bound to said atom of said first element in the presence of ammonia.

34. The method of claim 24, wherein:
said halide of said second element is $HfCl_4$.

35. The method of claim 24, wherein:
said halide of said second element is $ZrCl_4$.

36. An electronic device, comprising:
a silicon substrate;
an atom of a first element having only one positive divalent oxidation state chemically coupled to a silicon atom of said silicon substrate; and
an atom of a second element selected from the group consisting of Hf and Zr chemically coupled to said atom of said first element having only one positive divalent oxidation state.

37. The device of claim 36, wherein:
said atom of said first element having only one positive divalent oxidation state is an atom of an element selected from group IIA of the periodic table.

38. A semiconductor device, comprising:
a dielectric material which includes (i) an atom of a first element having only one positive divalent oxidation state chemically coupled to a silicon atom of a silicon substrate of said dielectric material and (ii) an atom of a second element selected from the group consisting of Hf and Zr chemically coupled to said atom of said first element having only one positive divalent oxidation state.

* * * * *